United States Patent
Håkansson

[11] Patent Number: 5,705,951
[45] Date of Patent: Jan. 6, 1998

[54] METHOD FOR CORRECTION OF ERROR SIGNALS IN A SIGNAL AMPLIFICATION SYSTEM AND AN APPARATUS USED FOR THAT PURPOSE

[76] Inventor: Bjarne Håkansson, Box 20, S-178 21 Ekerö, Sweden

[21] Appl. No.: 772,248

[22] Filed: Dec. 23, 1996

Related U.S. Application Data

[63] Continuation of Ser. No. 519,798, Aug. 28, 1995.

[51] Int. Cl.$^6$ .................................................. H03F 1/34
[52] U.S. Cl. .......................... 330/100; 330/103; 330/105; 330/108; 330/260; 330/293; 381/121
[58] Field of Search .............................. 330/100, 103, 330/105, 108, 260, 293; 381/120, 121

[56] References Cited

U.S. PATENT DOCUMENTS

| | | | |
|---|---|---|---|
| 3,872,247 | 3/1975 | Saville et al. | 381/121 X |
| 4,260,954 | 4/1981 | Crooks | 330/105 X |
| 5,245,296 | 9/1993 | Miller et al. | 330/105 X |

FOREIGN PATENT DOCUMENTS

| | | | |
|---|---|---|---|
| 24575/77 | of 0000 | Australia . | |
| 398 287 | 12/1977 | Germany | H04R 3/08 |

Primary Examiner—James B. Mullins
Attorney, Agent, or Firm—Michaelson & Wallace; Peter L. Michaelson; John C. Pokotylo

[57] ABSTRACT

In a method and by an apparatus for correction of error signals and for forming of an arbitrary transfer function being independent of the quality of a payload (loudspeaker; H1) included in a signal amplification system, a control system (9) is used for supplying of the input signal to a basic amplifier (1) driving the payload. Said control unit includes a further amplifier (9) having an inverted input being supplied with a feedback signal from the output of the basic amplifier. In such a case the further amplifier involves only an inverted input, said input signal is supplied through one (4) of the resistors (3, 4) included in the feedback loop.

13 Claims, 2 Drawing Sheets

METHOD FOR CORRECTION OF ERROR SIGNALS IN A SIGNAL AMPLIFICATION SYSTEM AND AN APPARATUS USED FOR THAT PURPOSE

CROSS REFERENCE TO RELATED APPLICATION

This application is a continuation of copending patent application Ser. No. 08/519,798, entitled "A Method for Correction of Error Signals in a Signal Amplification System and an Apparatus Used for That Purpose" filed on Aug. 28, 1995.

TECHNICAL FIELD

The present invention relates to the application fields involved in designing signal amplifiers. More exactly, the invention relates to a method for correction of error signals and for forming of an arbitrary transfer function being independent of the quality of the driven payload in a signal amplification system.

More specifically the fields of signal amplification are included in the audio field, where the amplified signal is supplied to another electronic or electro-mechanical equipment. Particularly the present invention is concerned with the design of a power amplifier, the output of which is driving a loudspeaker set, the impedance of which being dependent on the input signal frequency.

PRIOR ART

With respect to design of power amplifier circuits for loudspeakers, the principle of voltage control is used for more than fifty years. Voltage control results in a simple connection between the power amplifier and the loudspeaker. Simultaneously, theoretically it is possible, quite arbitrary, to mix amplifiers and loudspeakers.

As the loudspeakers of today in practice have anything but resistive qualities the use of such factors as the amplifier ability to supply enough current (as the loudspeaker elements often present very low impedances) and to withstand phase shifts (i.a. as the dividing filters together with the loudspeaker elements form a so called complex load, i.e. the combination of resistance, capacitance and inductance).

In addition the loudspeakers as such, and in particular the bass elements, give rise to an opposing electromotive force (back e.m.f.) when being supplied with a signal (as it is built from inductive elements). Such a back e.m.f. is undesirable and generally causes distorsion and often rises to considerable values.

This type of distorsion is percepted by the human ear as a false reproduction (i.a. as it is in form of a harmonic spectrum added to the original signal).

Effects of inertia by acceleration and retardation of the loudspeaker element generate error signals at the loudspeaker.

Another area of problems is to be found in the vibrations generated in the loudspeaker box as such, said vibrations acting on the loudspeaker diaphragm and producing distorsion. Such vibrations result in current flows returned to the amplifier and besides distorsion also causing stability problems.

Solutions of the problems mentioned above are discussed in AU-B1-24 575/77 and in SE-C-398 287.

However, common to the solutions presented and other methods for removing these problems (see FIG. 1) is, that when the impedance of the loudspeaker H1 is varied the system amplification is changed, resulting in a variable level for the output signal. In such a case the sound pressure balance is shifted for those frequencies where it takes place and where it does not. Audibly the sound is often found to be "cold" due to the fact that most of the dynamical loudspeakers have a heavy impedance decline in the area of 100 Hz through 2–3 kHz. Then the impedance is increased again. Most of the desribed systems, however, take care of the increased impedance but not of the low impedance. Also the most deep bass has a heavy declined impedance, further underlining the perceived "coldness" of the reproduced sound (a higher amplitude is obtained for the higher frequencies resulting in an impression of a "cold" sound). If a compensation is made for the maximum low impedance in order to make the impedance characteristic smooth, very much effect is lost through the compensation resistance which will have a much lower impedance than the actual load.

In the case of the prior known solution shown in FIG. 1C the loudspeaker will once more be voltage controlled which means a loss of 6 dB regulation capability. Futhermore, the input signal has to reach half the output value on condition that the resistors 2 and 3 are of equal value needed for an effective regulation of the frequency/amplitude response.

DESCRIPTION OF THE INVENTION

Though the present invention will be described in detail with reference to a loudspeaker, the payload may as well be any other type having non-linear frequency/impedance progress, such as e.g. tape recorders, linear motors etc. Thus, the invention must not be restricted to loudspeaker amplification circuits but it is also useful in all cases with non-linearly frequency/impedance payload circuits.

The purpose of the present invention is mainly to be able to reproduce sound signals within all the relevant audio area (covering the frequency band of 20–20,000 Hz) and that it is done without unwanted additional output signals being produced by the amplifier. Another purpose is that generated error signals are to be attenuated so that such an annoying distorsion is stopped and the payload (the loudspeaker) reproduces only the input signal applied to the system.

The purposes mentioned are obtained by the method for correction of error signals and for forming of an arbitrary transfer function being independent of the quality of the driven payload in a signal amplification system, where the payload is current driven by a basic amplifier supplied from a control unit, said control unit besides the input signal also being supplied with a feedback coupled basic amplifier output signal, whereby error signals generated in the payload by external actions or by self-induction are corrected in said basic amplifier, and the total system amplitude response at the output signal is controlled by a transfer function in a feedback circuit used for the output signal, said transfer function being selected to be linear in such a way that the payload is acting as being voltage controlled.

The method may be implemented by a constructive apparatus according to the present invention for correction of error signals and for forming of an arbitrary transfer function being independent of the quality of the driven payload in a signal amplification system, where a basic amplifier having inverted and non-inverted inputs and an output, said output being a current supply of the payload and said non-inverted input being supplied from the output of a control unit incorporated within a feedback system, is supplied with an input signal and with a feedback signal from the basic amplifier output.

Preferable embodiments are defined in the dependent claims.

SHORT DESCRIPTION OF THE DRAWINGS

The present invention will be described in more detail below in connection with embodiments, given as examples only and shown in the appended drawings, where FIGS. 1(a), 1(b), and 1(c) show amplifier circuits of prior known art;

FIG. 2 shows the prior known circuit being the basic circuit for the present invention; and FIGS. 3(a) and 3(b) show two different preferred embodiments of the circuitry of the present invention.

DETAILED DESCRIPTION OF EMBODIMENTS

The basic circuitry of prior known art as shown in FIGS. 1(a), 1(b), 1(c) and 2 is discussed above. Therefore, the prior known circuits will not be discussed in further detail but it will only be noticed that the circuits comprise an amplifier 1 feedbacked through the payload (loudspeaker) H1. The input signal is supplied to the non-inverted input (+) of the amplifier 1, the inverted input (−) of which being coupled to circuit ground through at least a resistor 2 and/or 4. The payload H1 may be paralelled by another resistor 3.

Figure 1A:
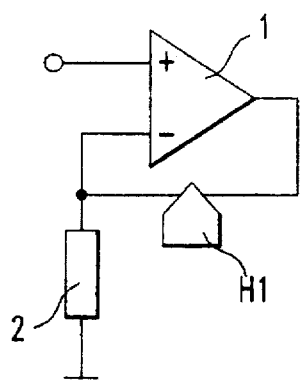
Figure 1B:
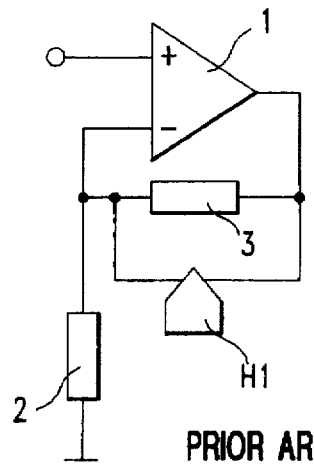
Figure 1C:
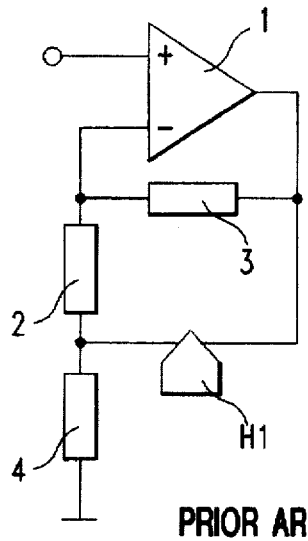
Figure 2:
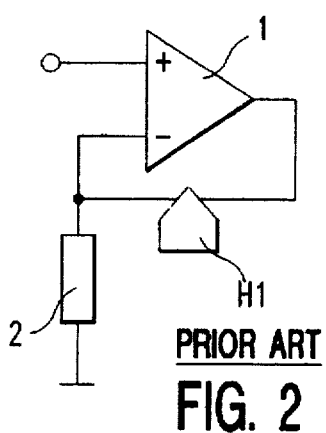
Figure 3A:
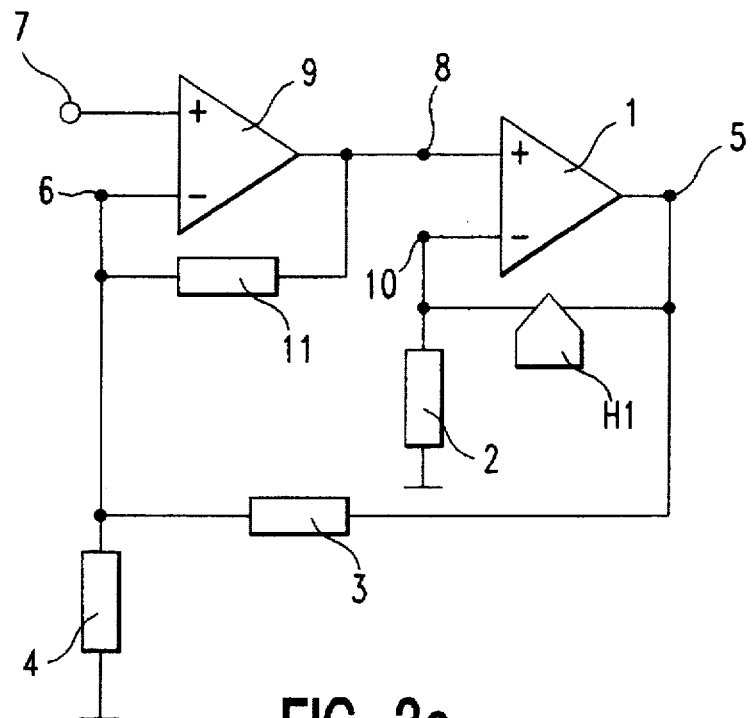
Figure 3B:
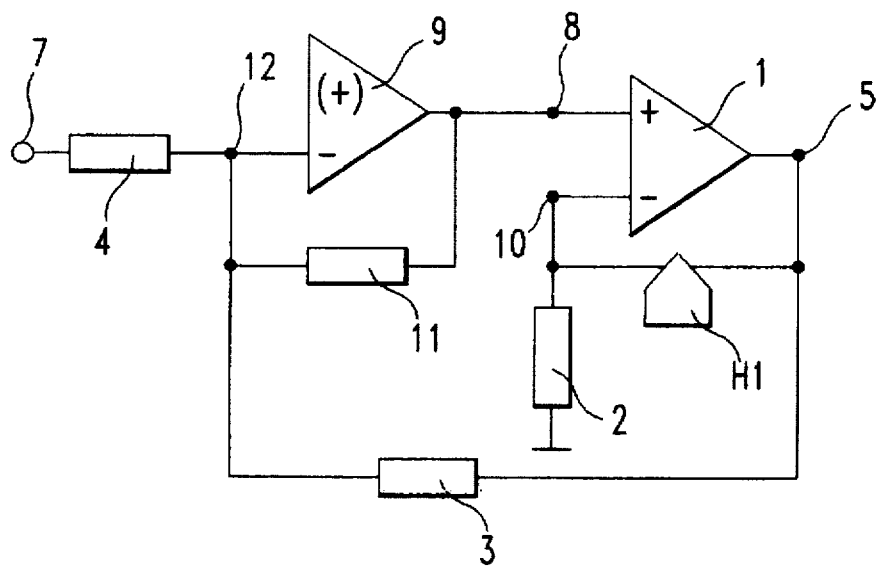

As already made clear above the present invention solves the problem of correcting error signals in the signal amplification system 1-4, H1. The method of the present invention is based on the fact that the payload H1 still is attached to the amplification circuit in prior known manner. To compensate for the effect of low impedance values of the payload on reproduction of the the output signal, the signal amplification system 1-4, H1 as a whole is incorporated in a further amplification system as shown by FIGS. 3(a) and 3(b). By doing so one has obtained that the error signals are immediately discovered and corrected by the basic amplifier 1.

Thus, the preferred embodiments of the circuitry of the present invention involve a further amplification system 5-12. The resistors 3 and 4 of the signal amplification system 1-4, H1 are in such a case connected to a feedback circuit between the output of the basic amplifier 1 and the inverted input (−) of a further amplifier 9 included in said further amplification system 5-12. The further amplifier 9 is as such feedbacked through a resistor 11 to the inverted input (−) of the further amplifier 9.

In one design of the preferred embodiments of the present invention the input signal 7 is, as shown in FIG. 3a, supplied to the non-inverted input (+) of the further amplifier 9. In that case the feedback line from the output 5 of the basic amplifier 1 goes through the resistor 3 to the inverted input (−) of the further amplifier 9, where the inverted input (−) serves also as a junction 6 for the further amplifier's 9 own feedback circuit including the resistor 11. The junction 6 is connected through the resistor 4 to ground.

At an alternative embodiment shown in FIG. 3b the input signal 7 is applied to the inverted input (−) of the further amplifier 9 through a resistor 4. The resistor 4 is connected between the signal input 7 and a junction 12 forming the inverted input (−) of the further amplifier 9. This junction 12 is also used for joining the two feedback lines 5-3-12 and 11-12.

Due to the internal construction of the further amplifier 9 (being quite conventional) having a so called basic amplification which is higher than what to be needed to drive the signal at the input 8 of the basic amplifier 1, the result will be that the output 5 of the basic amplifier 1 reaches such a level that the feedback system 3, 4, 9 will be balanced, i.e. the input 7 of the further amplifier 9 has the same value as the signal at the junction 6, and a correction will be automatically obtained for different impedance values at the payload H1.

The resulting effect of disturbances in the function of the payload (loudspeakers) H1 will be that due to the very low impedance output of the basic amplifier 1 (being several orders higher than the value of the resistance R1) the error signal appearing at the inverted input 10 of the basic amplifier 1 results in a compensation signal reverse phased to the error signal, whereby the error signal is extinguished automatically irrespective the base for the generation thereof.

The result will be that the frequency dependancy of the total system is determined by the function of the resistors 3 and 4. In audio context making the resistors linear results in a quite linear transfer function with respect to the amplitude/frequency seen at the output 5, which corresponds to a pure voltage control of the payload H1.

However, it is quite clear that the choice of the function of the resistors 3 and 4 may be arbitrary and that the response of the total system is depending only on the resistors 3 and 4 and not at all of the payload H1 quality.

The practical limits, however, are set by the output current capability, the coarse amplification and by the bandwidth of the basic amplifier 1.

The difficulties in obtaining the inventive solution are to be found in understanding the necessity of expanding the system also to comprise the further amplifier 9 for changing the payload H1 action in such a way that the system as a whole has a function corresponding to a voltage controlled payload H1 (a current controlled payload results in a non-linear frequency/amplitude function having a shape common to the one of the impedance/frequency function of the payload).

I claim:
1. An apparatus for correction of error signals and for forming of an arbitrary transfer function being independent of the quality of a driven payload having a first terminal connection and a second terminal connection in a signal amplification system, said apparatus comprising a control unit having at least one input and an output, and a basic amplifier having a non-inverting and an inverting input and an output, wherein said control unit being arranged to be supplied with an input signal;

the output of the control unit is connected to the non-inverting input of the basic amplifier;

the output of the basic amplifier coupled with the first terminal connection of the payload to drive the payload;

the output of the basic amplifier is connected to the input of the control unit to form a first feedback circuit; and the second terminal connection of the payload is connected to the inverting input of the basic amplifier to form a second feedback circuit.

2. An apparatus as set out in claim 1, where said control unit includes a further amplifier having a non-inverting input and an inverting input, said first feedback circuit comprising a first resistor arranged between the output of the basic amplifier and the inverting input of the further amplifier, the inverting input of said further amplifier being connected to a second resistor of said first feedback circuit, said first and second resistors being arranged to form said transfer function controlling the apparatus amplitude response of the output of the basic amplifier.

3. An apparatus as set out in claim 2, where said non-inverting input of the further amplifier is arranged to receive said input signal and the second resistor is provided between said inverting input of the said further amplifier and the ground.

4. An apparatus as set out in claim 2, where said inverting input of the further amplifier is arranged to receive said input signal via the second resistor, thus provided between said inverting input of the said further amplifier and a signal input.

5. A signal amplification apparatus, comprising a first amplifying unit having at least one input and an output;
- a second amplifying unit having an inverting input, a non-inverting input and an output, said output of the first amplifying unit being connected to the non-inverting input of the second amplifying unit;
- a payload having a first terminal connection and a second terminal connection, the first terminal connection of the payload connected to the output of the second amplifying unit and the second terminal connection of the payload connected to a first resistor in turn connected to the ground;
- a first feedback circuit connecting the output of the second amplifying unit to the input of the first amplifying unit; and
- a second feedback circuit connecting the payload and the first resistor to the inverting input of the second amplifying unit.

6. An apparatus as set out in claim 5, wherein the first amplifying unit has an inverting input and a non-inverting input and the first feedback circuit is connected to the inverting input of the first amplifying unit.

7. An apparatus as set out in claim 6, wherein said first feedback circuit comprises a second resistor provided between the output of the second amplifying unit and the inverting input of the first amplifying unit.

8. An apparatus as set out in claim 7, wherein said first feedback circuit comprises a third resistor provided between inverting input of the first amplifying unit and the ground, said non-inverting input of the first amplifying unit forming a signal input.

9. An apparatus as set out in claim 8, comprising a third feedback circuit connecting the output of said first amplifying unit to the inverting input of said first amplifying unit.

10. An apparatus as set out in claim 9, wherein said third feedback circuit comprises a fourth resistor.

11. An apparatus as set out in claim 9, wherein said third feedback circuit comprises a fourth resistor.

12. An apparatus as set out in claim 7, wherein said first feedback circuit comprises a third resistor provided between the inverting input of the first amplifying unit and a signal input.

13. An apparatus as set out in claim 12, comprising a third feedback circuit connecting the output of said first amplifying unit to the inverting input of said first amplifying unit.

* * * * *